United States Patent
Kwon

(10) Patent No.: US 11,864,412 B2
(45) Date of Patent: Jan. 2, 2024

(54) METHOD FOR MANUFACTURING HYBRID MOISTURE BARRIER LAYER

(71) Applicant: KOREA ELECTRONICS TECHNOLOGY INSTITUTE, Seongnam-si (KR)

(72) Inventor: Soon Hyung Kwon, Seongnam-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 460 days.

(21) Appl. No.: 17/128,850

(22) Filed: Dec. 21, 2020

(65) Prior Publication Data

US 2021/0114363 A1  Apr. 22, 2021

Related U.S. Application Data

(63) Continuation of application No. PCT/KR2020/006336, filed on May 14, 2020.

(30) Foreign Application Priority Data

May 17, 2019 (KR) .......................... 10-2019-0058317

(51) Int. Cl.
  *H10K 50/844*  (2023.01)
(52) U.S. Cl.
  CPC .................. *H10K 50/844* (2023.02)
(58) Field of Classification Search
  CPC .................................................. H10K 50/844
  See application file for complete search history.

(56) References Cited

FOREIGN PATENT DOCUMENTS

| JP | 2011-241421 A | 12/2011 |
|----|---------------|---------|
| JP | 5929775 B | 6/2016 |
| JP | 5929775 B2 * | 6/2016 |
| KR | 10-2009-0091556 A | 8/2009 |
| KR | 10-2015-0022494 A | 3/2015 |
| KR | 10-1737757 B1 | 5/2017 |
| WO | WO 2011/149317 A2 | 12/2011 |

OTHER PUBLICATIONS

JP5929775, machine translation. (Year: 2016).*
International Search Report and Written Opinion dated Aug. 11, 2020 in International Application No. PCT/KR2020/006336, in 9 pages. (English translation of ISR).

* cited by examiner

*Primary Examiner* — Robert A Vetere
(74) *Attorney, Agent, or Firm* — Knobbe, Martens, Olson & Bear, LLP

(57) ABSTRACT

This application relates to a method for manufacturing a hybrid moisture barrier layer. In one aspect, the method includes preparing a base film and applying a photo-curable or heat-curable solution material to the base film, followed by photocuring or thermal curing to deposit at least one first moisture barrier layer. The method also includes depositing at least one second moisture barrier layer on the base film through atomic layer deposition (ALD), the second moisture layer being ⅓ to ½ the total thickness of the first moisture barrier. According to various embodiments, a combination of a moisture barrier layer formed by applying the photo-curable or heat-curable solution and a moisture barrier layer formed by atomic layer deposition at an effective thickness ratio brings about an effective reduction in production lead time as well as an improvement in the reliability of moisture barrier effect.

6 Claims, 4 Drawing Sheets

METHOD FOR MANUFACTURING HYBRID MOISTURE BARRIER LAYER

CROSS REFERENCE TO RELATED APPLICATIONS

This is a continuation application of International Patent Application No. PCT/KR2020/006336, filed on May 14, 2020, which claims priority to Korean Patent Application No. 10-2019-0058317 filed on May 17, 2019, contents of both of which are incorporated herein by reference in their entireties.

BACKGROUND

Technical Field

An embodiment of the present disclosure relates to a method of manufacturing a hybrid moisture barrier layer.

Description of Related Technology

In general, organic electronic devices such as organic light-emitting diodes (OLEDs) and organic solar cells are very vulnerable to moisture and oxygen in the air. In order to increase the lifetime of such devices, an encapsulation process is additionally required.

SUMMARY

One inventive aspect is a method of manufacturing a hybrid moisture barrier layer to realize a hybrid moisture-proof layer that can effectively present the introduction of external moisture or foreign substances into various device modules such as display modules, solar cell modules, and the like.

In addition, the present disclosure is intended to effectively improve the function of a hybrid moisture barrier layer and the manufacturing process thereof by combining a moisture barrier layer obtained through photocuring or heat curing of a liquid solution and a moisture barrier layer obtained through atomic layer deposition (ALD).

In addition, the present disclosure is intended to increase the reliability of the formation of the entire moisture barrier layer by further performing a process of forming a planarization layer before forming the moisture barrier layer and to more effectively protect a device module provided with the moisture barrier layer from external moisture or foreign substances.

Another aspect provides a method of manufacturing a hybrid moisture barrier layer, including: preparing a base film, laminating at least one first moisture barrier layer by applying a photocurable or heat-curable solution material on the base film and then performing photocuring or heat curing, and laminating at least one second moisture barrier laser having a thickness corresponding to ½ to ⅓ of the total thickness of the first moisture barrier layer by performing atomic layer deposition (ALD) on the base film.

Here, the first moisture barrier layer may be formed of a photocurable material that is photocured using UV or DUV (deep UV) or a heat-curable material, including aluminum oxide ($Al_2O_3$), perhydropolysilazane, IGZO (indium gallium zinc oxide), inorganic polysilazane, or combinations thereof, and the second moisture barrier layer may be formed of aluminum oxide ($Al_2O_3$).

Also, in the laminating the first moisture barrier layer, the first moisture barrier layer may be formed at a molar concentration of 0.2 M to 2 M and a processing temperature of 80° C. to 150° C.

Another aspect provides a method of manufacturing a hybrid moisture barrier layer, including: preparing a base film, forming a planarization layer on the base film, laminating at least one first moisture barrier layer by applying a photocurable or heat-curable solution material on the base film and then performing photocuring or heat curing, and laminating at least one second moisture barrier layer having a thickness corresponding to ½ to ⅓ of the total thickness of the first moisture barrier layer by performing atomic layer deposition (ALD) on the base film.

Here, the planarization layer may include any one selected from the group consisting of $SiO_2$, SiN, $SiO_x$, $SiN_x$, $TaO_x$, $AlO_x$, $ZrO_2$, PE-TEOS, $Si_3N_4$, poly-Si, $TiO_2$, and combinations thereof, in which x is a natural number, the first moisture barrier layer may be formed of a photocurable material that is photocured using UV or DUV (deep UV) or a heat-curable material, including aluminum oxide ($Al_2O_3$), perhydropolysilazane, IGZO (indium gallium zinc oxide), inorganic polysilazane, or combinations thereof, and the second moisture barrier layer may be formed of aluminum oxide ($Al_2O_3$).

Also, in the laminating the first moisture barrier layer, the first moisture barrier layer may be formed at a molar concentration of 0.2 M to 2 M and a processing temperature of 80° C. to 150° C.

The features and advantages of the present disclosure will become more apparent with the following detailed description based on the accompanying drawings.

Before the present disclosure is described in more detail, it must be noted that the terms and words used in the present specification and claims should not be interpreted as being limited to typical meanings or dictionary definitions, but should be interpreted as having meanings and concepts relevant to the technical scope of the present disclosure based on the rule according to which an inventor can appropriately define a concept implied by a term to best describe the method he or site knows for carrying out the disclosure.

According to embodiments of the present disclosure, in the formation of a moisture barrier layer for preventing penetration of external moisture or foreign substances, a moisture barrier layer obtained by applying a photocurable or heat-curable solution and a moisture banter layer obtained through atomic layer deposition are combined at an effective thickness ratio, thereby effectively reducing a production lead time and further increasing the reliability of a moisture barrier effect.

Moreover, it is possible to obtain the moisture barrier layer at an effective thickness using the photocurable or heat-curable solution at an effectively controlled molar concentration under predetermined processing conditions, and to effectively cover cracks or unnecessary pinholes that form during the curing of the heat-curable or photocurable material with a second moisture barrier layer obtained through secondary atomic laser deposition, whereby functions of the layers can be effectively exhibited together through bonding therebetween.

Furthermore, the formation of a planarization layer before forming the moisture barrier layer on the base film is effective at improving the effective bonding of she hybrid moisture barrier layer and the reliability with which moisture and contaminants from the external environment are prevented from penetrating.

DETAILED DESCRIPTION

Figure 1:
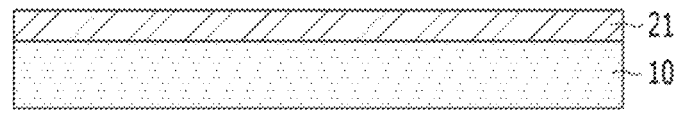
FIG. 1, FIG. 2, FIG. 3 and FIG. 4 show a process of manufacturing a hybrid moisture barrier layer according to an embodiment of the present disclosure.

In the case in which an electronic device is manufactured without any treatment, even when using a plastic substrate instead of existing glass in order to realize flexibility thereof, moisture and oxygen easily penetrate into the interior of the device, and thus serious problems in which the light-emitting area is decreased or the device itself becomes incapable of emitting light may occur.

Accordingly, a thin-film-type moisture barrier layer has to be formed on a substrate or a film, but it is necessary to develop a method of manufacturing a moisture barrier layer that can effectively exhibit the function of the moisture barrier layer while providing a process for uniform coating thereof and solving the problem of reduced productivity owing to the process.

The aspects, specific advantages and novel features of the present disclosure will be more clearly understood from the following detailed description and embodiments when taken m conjunction with the accompanying drawings. Wherever possible, the same reference numerals will be used throughout the drawings and the description to refer to the same or like elements. Furthermore, the terms "one side", "the remaining side", "first", "second", etc. are only used to distinguish one element from another element, and these elements should not be limited by these terms. In the following description, it is to be noted that a detailed description of the related art, when it would make the gist of the present disclosure unclear, will be omitted.

Hereinafter, a detailed description will be given of embodiments of the present disclosure with reference to the appended drawings, in which the same reference numerals designate the same members.

FIGS. 1 to 4 show the process of manufacturing a hybrid moisture barrier layer according to an embodiment of the present disclosure.

The method of manufacturing a hybrid moisture barrier layer according to an embodiment of the present disclosure includes preparing a base film 10, laminating at least one first moisture barrier layer 21 by applying a photocurable or heat-curable solution material on the base film 10 and then performing photocuring or heat curing, and laminating at least one second moisture barrier layer 22 having a thickness corresponding to ½ to ⅓ of the total thickness of the first moisture barrier layer 21 by performing atomic layer deposition (ALD) on the base film 10.

FIG. 1 shows the formation of the first moisture barrier layer 21 on the base film 10. The base film 10 is a part that is connected to the applied display, solar cell, and other device modules, and the formation of a hybrid moisture-proof layer on the base film 10 makes it possible to fundamentally block the introduction of external moisture or foreign substances into various device modules.

The base film 10 may be applied in the form of a transparent film or substrate to a device that requires visibility, such as a display module, and may be formed of polyethylene terephthalate (PET), polycarbonate (PC), polymethyl methacrylate (PMMA), polyethylene naphthalate (PEN), polyethersulfone (PES), cyclic olefin copolymer (COC), triacetyl cellulose (TAC) film, polyvinyl alcohol (PVA) film, polyimide (PI) film, polystyrene (PS), biaxially oriented polystyrene (biaxially oriented PS containing K resin, BOPS), glass, or reinforced glass. Also, in a module that does not require transparency, any substrate or film material may be used, so long as it is able to support the process of forming a hybrid moisture barrier layer and is capable of being applied thereto.

Figure 2:
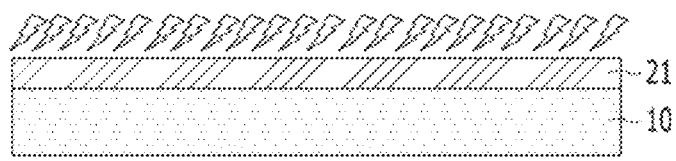
Figure 3:
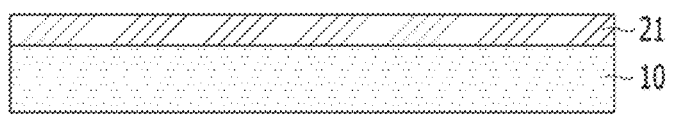

FIGS. 2 and 3 show the application of a solution material for the first moisture barrier layer 21 and the photocuring or heat curing thereof in order to form the first moisture barrier layer 21 on the base film 10.

As shown in FIGS. 2 and 3, forming the first moisture barrier layer 21 includes applying a photocurable or heat-curable solution material on the base film 10 and then performing photocuring or heat curing to form at least one layer. Here, applying the photocurable or heat-curable solution material may be performed through a process such as spin coaling, etc., after which the applied material may be cured using light or heat, thereby forming the first moisture barrier layer 21.

Here, photocuring may be performed using ultraviolet (UV) rays, such as UV or deep UV (180-600 nm).

The first moisture barrier layer 21 may be formed to a thickness suitable for the applied device module by laminating one or more layers in the form of a thin film.

The first moisture barrier layer 21 may be formed of a photocurable material that is photocured using UV or DUV (deep UV) or a heat-curable material, including aluminum oxide ($Al_2O_3$), perhydropolysilazane, IGZO (indium gallium zinc oxide), inorganic polysilazane, or combinations thereof.

Specifically, in the formation of the first moisture barrier layer 21, aluminum oxide ($Al_2O_3$), perhydropolysilazane, IGZO (indium gallium zinc oxide), or inorganic polysilazane may be used at a molar concentration of 0.2 M to 2 M and a processing temperature of 80° C. to 150° C. thereby obtaining the effective properties and thickness of the first moisture barrier layer 21.

If the processing temperature is lower than 80° C., it is difficult to form a film of the solution material or a coating film during the process. On the other hand, if she processing temperature is higher than 150° C., the formed film or coaling film may curl or be damaged. Hence, it is preferred that the manufacturing process be performed at a processing temperature of 80° C. to 150° C.

Also, if the molar concentration is less than 0.2 M, it is difficult to form a film or a coating film due to the weak supporting force during the manufacturing process. On the other hand, if the molar concentration exceeds 2 M, it is difficult to attain visibility upon application to a module that requires visibility, such as a display, making it impossible to satisfy the visibility required by the applied module. Hence, in the molar concentration range of 0.2 M to 2 M, the processing reliability of the first moisture barrier layer 21 and the structural bonding thereof may be attained.

Figure 4:
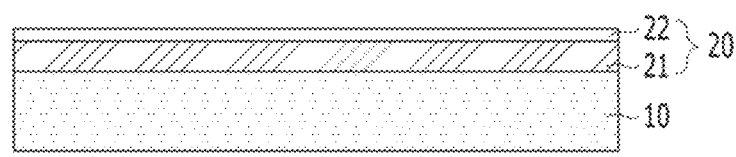

FIG. 4 shows the manufacture of an ultimate hybrid moisture barrier layer by laminating the second moisture barrier layer 22 on the first moisture barrier layer 21.

Specifically, at least one second moisture barrier layer 22 having a thickness corresponding to ½ to ⅓ of the total thickness of the first moisture barrier layer 21 is laminated on the first moisture barrier layer 21 through atomic layer deposition (ALD).

The second moisture barrier layer 21 is formed through atomic layer deposition. Forming all of the moisture barrier lasers through atomic layer deposition method is problematic because of the high cost or very low productivity due to the long production lead time. Therefore, in an embodiment of the present disclosure, a hybrid moisture barrier layer is provided, and thus the characteristics of individual lasers are effectively combined, thereby effectively improving productivity and also attaining the function or structural reliability of the moisture barrier layer.

The atomic layer deposition may be performed through a known process, so a detailed description thereof is omitted herein. The first moisture barrier layer 21 may be provided in the form of a single layer or multiple layers by curing a solution coating material through photocuring or heat curing. Here, even in the case in which it is provided in the form of a thin film, some pinholes, that is, fine gas cavities like needle-pricked holes, may form during the curing process. The position or size thereof is also random, which may cause problems in preventing moisture penetration. Hence, all possible pinholes during the deposition process may be covered through atomic layer deposition, which is known to be ideal for depositing a uniform thin film on an entirety of a surface, thereby manufacturing the most effective hybrid moisture barrier layer including the first moisture barrier layer 21 and the second moisture barrier layer 22, which are combined together.

Figure 10:
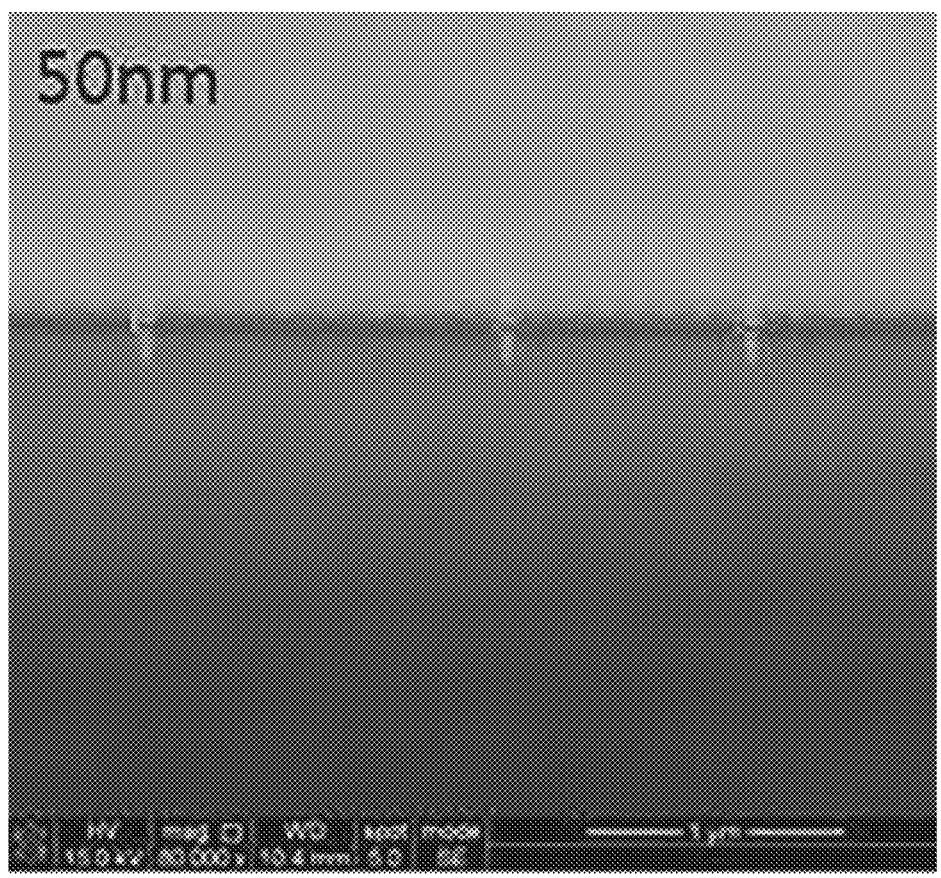
FIG. 10 is an image showing the hybrid moisture barrier layer according to an embodiment of the present disclosure.

For example, as shown in FIG. 10, a first moisture barrier layer 21 having a thickness of 50 nm was formed using 1.2 M aluminum oxide ($Al_2O_3$) under processing conditions of 80° C. and 6 hours. Moreover, a first moisture barrier layer 21 was laminated to 15 nm thereon through atomic layer deposition to afford an ultimate hybrid moisture barrier layer, which can be found to exhibit a moisture barrier effect to the extent that a water vapor transmission rate (WVTR) is about $10^{-3}$ $g/m^2/day$.

Furthermore, the hybrid moisture barrier layer according to an embodiment of the present disclosure may be formed by laminating the first moisture barrier layer 21 and the second moisture barrier layer 22 on the base film, and in order to effectively satisfy the water vapor transmission rate (WVTR) depending on the applied device module, it is possible to manufacture a hybrid moisture barrier layer having higher WVTR or functional specifications suitable for the corresponding device module by alternately and repeatedly laminating the first moisture barrier layer 21 and the second moisture barrier layer 22.

FIGS. 5 to 9 show the process of manufacturing a hybrid moisture barrier layer according to another embodiment of the present disclosure.

The method of manufacturing a hybrid moisture barrier layer according to another embodiment of the present disclosure includes preparing a base film 10a, forming a planarization layer 20a on the base film 10a, laminating at least one first moisture barrier layer 31a by applying a photocurable or heat-curable solution material on the base film 10a and then performing photocuring or heat curing, and laminating at least one second moisture barrier layer 32a having a thickness corresponding to ½ to ⅓ of the total thickness of the first moisture barrier layer 31a by performing atomic layer deposition (ALD) on the base film 10a.

Figure 5:
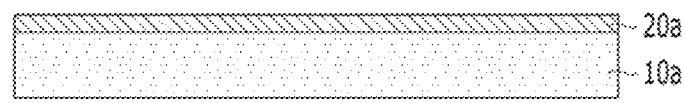
FIG. 5, FIG. 6, FIG. 7, FIG. 8 and FIG. 9 show a process of manufacturing a hybrid moisture barrier layer according to another embodiment of the present disclosure.

FIG. 5 shows the formation of the planarization layer 20a on the base film 10a.

The base film 10a may be applied in the form of a transparent film or substrate to a device that requires visibility, such as a display module, and may be formed of polyethylene terephthalate (PET), polycarbonate (PC), polymethyl methacrylate (PMMA), polyethylene naphthalate (PEN), polyethersulfone (PBS), cyclic olefin copolymer (COC), triacetyl cellulose (TAC) film, polyvinyl alcohol (PVA) film, polyamide (PI) film, polystyrene (PS), biaxially oriented polystyrene (biaxially oriented PS containing K resin, BOPS), glass, or reinforced glass. Also, in a module that does not require transparency, any substrate or film material may be used, so long as it is able to support the process of forming a hybrid moisture barrier layer and is capable of being applied thereto.

The planarization layer 20a includes any one selected from the group consisting of $SiO_2$, SiN, $SiO_x$, $SiN_x$, $TaO_x$, $AlO_x$, $ZrO_2$, PE-TEOS, $Si_3N_4$, poly-Si, $TiO_2$, and combinations thereof, in which x is a natural number. The planarization layer 20a may be formed through chemical vapor deposition (CVD) or sputtering. The planarization layer 20a is capable of effectively improving the bonding strength between first moisture barrier layers 31a laminated on the base film 10a or the reliability of lamination bonding, and increasing the structural reliability for achieving the effective function of the hybrid moisture barrier layer.

Figure 6:
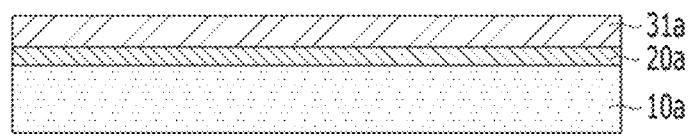

Next, FIG. 6 shows the application of a solution material for the first moisture barrier later 31a on the planarization layer 20a. The base film 10a is a part that is connected to the applied display, solar cell, and other device modules, and the formation of a hybrid moisture barrier layer 30a on the base film 10a makes it possible to fundamentally block the introduction of external moisture or foreign substances into various device modules.

Figure 7:
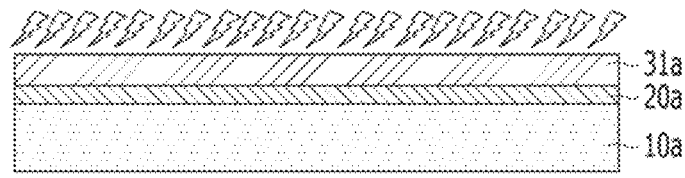
Figure 8:
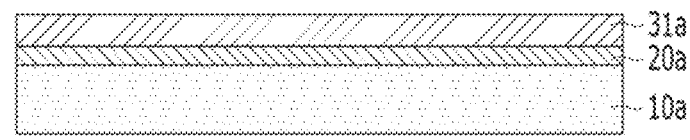

Next FIGS. 7 and 8 show photocuring or heat curing of the solution material for the first moisture barrier layer 31a applied on the planarization layer 20a.

As shown in FIGS. 7 and 8, forming the first moisture barrier layer 31a includes applying a photocurable or heat-curable solution material on the base film 10a and then performing photocuring or heat curing to form at least one layer. Here, applying the photocurable or heat-curable solution material may be performed through various processes such as spin coating, dip coating, etc., after which the applied material may be cured using light or heat, thereby forming the first moisture barrier layer 21.

Here, photocuring mas be performed using ultraviolet (UV) rays, such as UV or deep UV (180-600 nm).

The first moisture barrier layer 31a may be formed to a thickness suitable for the applied device module by laminating one or more layers in the form of a thin film.

The first moisture barrier layer 31a may be formed of a photocurable material that is photocured using UV or DUV (deep UV) or a heat-curable material, including aluminum oxide ($Al_2O_3$), perhydropolysilazane, IGZO (indium gallium zinc oxide), inorganic polysilazane, or combinations thereof.

Specifically, in the formation of the first moisture barrier layer 31a, aluminum oxide ($Al_2O_3$), perhydropolysilazane, IGZO (indium gallium zinc oxide), or inorganic polysilazane may be used at a molar concentration of 0.2 M to 2 M and a processing temperature of 80° C. to 150° C., thereby obtaining the effective properties and thickness of the first moisture barrier layer 31a.

If the processing temperature is lower than 80° C., it is difficult to form a film of the solution material or a coating film during the process. On the other hand, if the processing temperature is higher than 150° C., the formed film or coating film may curl or be damaged. Hence, it is preferred that the manufacturing process be performed at a processing temperature of 80° C. to 150° C.

Also, if the molar concentration is less than 0.2 M, it is difficult to form a film or a coating film due to the weak supporting force during the manufacturing process. On the other hand, if the molar concentration exceeds 2 M, it is difficult to attain visibility upon application to a module that requires visibility, such as a display, so the visibility required by the applied module cannot be satisfied. Hence, in the molar concentration range of 0.2 M to 2 M, the processing reliability of the first moisture barrier layer 21 and structural bonding thereof may be attained.

Figure 9:
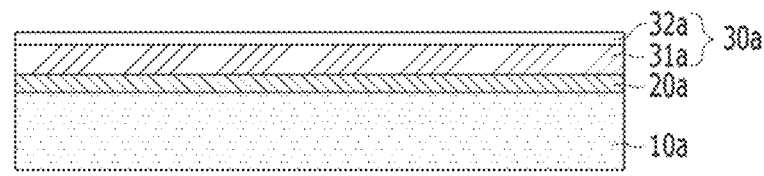

FIG. 9 shows the manufacture of an ultimate hybrid moisture barrier 30a layer by laminating the second moisture barrier layer 32a on the first moisture barrier layer 31a.

Specifically, at least one second moisture barrier layer 32a having a thickness corresponding to ½ to ⅓ of the total thickness of the first moisture barrier laser 31a is laminated on the first moisture barrier layer 31a through atomic layer deposition (ALD).

The second moisture barrier layer 32a is formed through atomic layer deposition. Forming all of the moisture barrier layers through the atomic layer deposition method is problematic because of the high cost or very low productivity due to the long production lead time. Therefore, in an embodiment of the present disclosure, a hybrid moisture barrier layer is provided, and thus the characteristics of individual layers are effectively combined, thereby effectively improving productivity and also attaining the function or structural reliability of the moisture barrier layer.

The atomic layer deposition may be performed through a known process, so a detailed description thereof is omitted herein. The first moisture barrier layer 31a may be provided in the form of a single layer or multiple layers by curing a solution coating material through photocuring or heat curing. Here, even in the case in which it is provided in the form of a thin film, some pinholes, that is, fine gas cavities like needle-pricked holes, may form during the curing process. The position or size thereof is also random, which may cause problems in preventing moisture penetration. Therefore, all possible pinholes during the deposition process may be covered through atomic layer deposition, which is known to be ideal for depositing a uniform thin film on an entirety of a surface, thereby manufacturing the most effective hybrid moisture barrier layer including the first moisture barrier layer 31a and the second moisture barrier layer 32a, which are combined together.

In addition, the hybrid moisture barrier layer according to an embodiment of the present disclosure may be formed by laminating the first moisture barrier layer 31a and the second moisture barrier layer 32a on the base film 10a, and in order to effectively satisfy the water vapor transmission rate (WVTR) depending on the applied device module, it is possible to manufacture a hybrid moisture barrier layer having higher WVTR or functional specifications suitable for the corresponding device module by alternately and repeatedly laminating the first moisture barrier layer 31a and the second moisture barrier layer 32a.

In the method of manufacturing the hybrid moisture barrier layer 30a according to another embodiment of the present disclosure, processes other than the formation of the planarization layer 20a on the base film 10a shown in FIG. 5 overlap the corresponding configurations and steps of FIGS. 1 to 4, which show the method of manufacturing the hybrid moisture barrier layer 20 according to an embodiment of the present disclosure described above, and thus a detailed description thereof is omitted herein.

Although the embodiments of the present disclosure have been disclosed for illustrative purposes regarding the method of manufacturing the hybrid moisture barrier layer, those skilled in the art will appreciate that various modifications, additions said substitutions are possible, without departing from the scope and spirit of the disclosure as disclosed in the accompanying claims. Accordingly, simple modifications or variations of the present disclosure fall within the scope of the present disclosure as defined in the accompanying claims.

What is claimed is:

1. A method of manufacturing a hybrid moisture barrier layer, comprising:

preparing a base film;

laminating at least one first moisture barrier layer over the base film by applying a curable solution material over the base film and then performing photocuring or heat curing on the curable solution material, the curable solution material being photo-curable or heat-curable; and laminating at least one second moisture barrier layer over the at least one first moisture barrier layer by performing atomic layer deposition (ALD) such that the at least one first moisture barrier is interposed between the base film and the at least one second moisture barrier layer, the at least one second moisture barrier layer having a thickness of ½ to ⅓ of a thickness of the at least one first moisture barrier layer, wherein the curable solution material comprises aluminum oxide ($Al_2O_3$) or IGZO (indium gallium zinc oxide), and wherein the laminating comprises forming the at least one first moisture barrier layer using the curable solution material comprising aluminum oxide ($Al_2O_3$) or IGZO (indium gallium zinc oxide) at a molar concentration of 0.2 M to 2 M and a processing temperature of 80° C. to 150° C.

2. The method of claim 1, wherein each of the at least one first moisture barrier layer and the at least one second moisture barrier layer comprises aluminum oxide ($Al_2O_3$).

3. The method of claim 1, further comprising:

forming a planarization layer over the base film such that the planarization layer is interposed between the at least one first moisture barrier layer and the base film.

4. The method of claim 3, wherein the planarization layer comprises any one selected from the group consisting of $SiO_2$, $SiO_x$, $SiN_x$, $TaO_x$, $AlO_x$, $ZrO_2$, PE-TEOS, $Si_3N_4$, poly-Si, $TiO_2$, and combinations thereof, in which x is a natural number.

5. The method of claim 1, wherein while the at least one first moisture barrier layer is being formed, a plurality of pin holes are formed in the at least one first moisture barrier layer, and wherein the plurality of pin holes are covered through the atomic layer deposition.

6. The method of claim 1, wherein the curable solution material comprises aluminum oxide ($Al_2O_3$) at the molar concentration of 1.2 M.

* * * * *